(12) United States Patent
Fasano

(10) Patent No.: US 11,868,684 B2
(45) Date of Patent: Jan. 9, 2024

(54) DIGITAL PLATFORM USING CYBER-PHYSICAL TWIN STRUCTURES PROVIDING AN EVOLVING DIGITAL REPRESENTATION OF A RISK-RELATED REAL WORLD ASSET FOR QUANTIFYING RISK MEASUREMENTS, AND METHOD THEREOF

(71) Applicant: SWISS REINSURANCE COMPANY LTD., Zurich (CH)

(72) Inventor: Pierluigi Fasano, Zurich (CH)

(73) Assignee: SWISS REINSURANCE COMPANY LTD., Zurich (CH)

( * ) Notice: Subject to any disclaimer, the term of this patent is extended or adjusted under 35 U.S.C. 154(b) by 471 days.

(21) Appl. No.: 17/074,114

(22) Filed: Oct. 19, 2020

(65) Prior Publication Data
US 2021/0248289 A1  Aug. 12, 2021

Related U.S. Application Data

(63) Continuation of application No. PCT/EP2020/053646, filed on Feb. 12, 2020.

(51) Int. Cl.
*G06F 30/20* (2020.01)
*G06F 17/18* (2006.01)

(52) U.S. Cl.
CPC .............. *G06F 30/20* (2020.01); *G06F 17/18* (2013.01)

(58) Field of Classification Search
CPC .................. G06F 30/20; G06F 17/18
See application file for complete search history.

(56) References Cited

U.S. PATENT DOCUMENTS

| | | | |
|---|---|---|---|
| 10,552,695 B1 * | 2/2020 | Bush | G06N 7/01 |
| 2017/0286572 A1 * | 10/2017 | Hershey | B64F 5/60 |
| 2017/0372431 A1 * | 12/2017 | Perl | G06Q 40/08 |
| 2018/0054376 A1 * | 2/2018 | Hershey | H04L 43/067 |
| 2018/0300816 A1 * | 10/2018 | Perl | G06Q 50/01 |

* cited by examiner

*Primary Examiner* — Chuen-Meei Gan
(74) *Attorney, Agent, or Firm* — Oblon, McClelland, Maier & Neustadt, L.L.P.

(57) ABSTRACT

A digital device is provided with circuitry configured to select object elements stored in a storage of the digital device, and assemble the selected object elements, a plurality of sensors configured to measure at least one parameter of structural parameter, operational parameter, and environmental status parameter, the at least one parameter being associated with a physical object represented by the assembled object elements, wherein the assembled object elements include data structure representing states of subsystems of the physical object, and the data structure holds a value of the at least one parameter.

16 Claims, 6 Drawing Sheets

DIGITAL PLATFORM USING CYBER-PHYSICAL TWIN STRUCTURES PROVIDING AN EVOLVING DIGITAL REPRESENTATION OF A RISK-RELATED REAL WORLD ASSET FOR QUANTIFYING RISK MEASUREMENTS, AND METHOD THEREOF

CROSS-REFERENCE TO RELATED APPLICATIONS

This is a continuation application of International Patent Application No. PCT/EP2020/053646 filed Feb. 12, 2020, the disclosure of which is hereby incorporated by reference in its entirety.

FIELD OF THE INVENTION

The present invention relates to a digital-based system for avatar measurements based on evolving real-world measuring parameters. In particular, it relates to a digital system operating based on versatile digital avatars providing exact replicas or digital twins of physical objects and processes. Such systems are used to operate complex products and processes as cyber-physical manufacturing systems or therapeutic systems in the field of precise personalized and predictive medicine. More particular, the invention relates to digital systems proliferatingly using avatar measurements in the context of the Internet of Things (IoT) and machine learning technologies.

BACKGROUND OF THE INVENTION

In all fields of technology, it is often a requirement to make assessment and/or predictions regarding the evolving operation or status of real world physical systems, assets or living objects, such as electro-mechanical systems, product processing systems, time characteristics and temporal behavior of buildings and constructions, or human beings or animals based on measured parameters and sensory data, for example for cyber-physical manufacturing, precise personalized and predictive medicine (e.g. telematics based), floating short or long scale risk assessment and measurements of physical real-world assets, or augmented or mixed reality technologies. For example, it may be desirable to automatically predict a remaining useful life of a technical system operatable within an acceptable failure risk, such as an aircraft engine, to help plan when the system should be replaced. Further, an operator of a system or physical asset may want to monitor a condition or a portion of the system or physical asset, to allow for conducting proper technical maintenance, etc. However, despite the improvements in sensor and computer technologies, accurately making such risk assessments and/or predictions is still a difficult technical task. For example, an event that occurs while a system or physical asset is not operating may also impact the remaining useful life and/or condition of the system or asset but are not taken into account by typical approaches in the prior art.

A real world physical system can be associated with asset's or system's components, such as sensors and actuators. Example of these are smart homes or Advance Driver Assistance Systems (ADAS) of cars. The monitored systems and assets can be spatially distributed and, thus, these systems and assets include components and subsystems that are also spatially distributed. As a consequence, there may be a need to provide an appropriate information transportation and distribution that serves to sense and transmit measuring parameter values and data, and control the spatially distributed components and subsystems in order for the system or asset to function efficiently and safely. In the state of the art, despite the fact that IoT provides a new dimension of connectivity, there is still a great need for systems and technologies that provides connectivity and computational intelligence for the system's components that are connected to the IoT. It is therefore a demand to provide technical systems and methods to allow technical assessments and/or automated predictions and forecasts for physical systems e.g. associated with the IoT in an automatic and technically precise manner relying on measured physical parameters.

Another technical problem to provide such systems is, that the number of factors and parameters to monitor, assess and/or monitor e.g. for securing maintenance and/or to operate real world physical or intangible assets or objects as e.g. large, complex industrial systems and their associated apparatuses such as engines or product processing devices etc., or to continuously monitor physical medical condition parameters of living objects such as human beings or animals, in particular for interventions and optimization based on such factors (for example for asset utilization, consumption reduction, preventive measures, physical inspections, physical damage state assessment work-scope, and operation capacity etc.) is often that large that it has to be performed in nature and in loco and is time-consuming and technically complex. Thus, it is another requirement to provide technical systems and methods to allow technical assessments and/or automated predictions and forecasts for the evolution of physical systems.

Finally, the machine-based prediction or forecast of occurrence probabilities for events causing impacts, i.e. occurring risks, is technically difficult to be realized because of their long-tail nature and their susceptibility to measuring and parametrizing quantitative impact factors and to capturing temporal time developments and parameter fluctuations. Automation of prediction and modeling of catastrophes and risk accumulation is especially challenging as there is limited historic loss data available, and new risk events with new characteristics keep emerging. In addition to finding, triggering and/or mitigating valuable loss and exposure data where existing, it is therefore important to reduce the reliance on historic data by using novel modelling techniques going beyond traditional data analysis and predictive modeling approaches and techniques by monitoring a controllable cause-effect chain. Risk driven systems have been developed and used triggered and signaled by automated forecast systems. Such systems are able to predictively and quantitatively generate expected occurrence probability of physical events and their impact such as losses to physical assets and objects typically starting from a set of modelling scenarios, which heavily depend in their timely development on the modelling technique. So there is a further requirement, to provide a new technical system to overcome these problems.

Digital representations (avatars) of twinned physical real-world assets and objects are herein referred as digital twins, i.e. an evolving digital data representation of a historical and current behavior of the twinned physical real-world asset and object or process. Thus, a digital representation of twinned physical real-world asset and object is the exact digital replica of the twinned physical real-world asset and object. The resulting digital avatar allows directly linking modelling structures and simulation techniques with sensors and big data. For example, the digital twin of an automobile is a digital, 3D representation of every part of the vehicle, technically replicating the physical world so accurately that a human could virtually operate the vehicle exactly as she/he would in the physical world and get the same responses, digitally simulated. It is to be noted, that in this applications, physical assets may also refer to physical processes, which are digitally twinned. Further, in this application, the sophisticate digital twins may continuously pull real-time sensor and systems data to provide precise snapshots of the physical twin's current state. These data can then be integrated with historical data and predictive technologies allowing to provide signals related to potential issues and/or trigger the indication of solutions. The inventive solution of this application based on the provided digital risk twin technology can profoundly enhance the ability to make or trigger proactive, measuring data-driven decisions, increasing efficiency and avoiding potential issues by reducing the risk measure provided by the inventive system. In fact, the invention enables to explore possible futures by exploring what-if scenarios based on the current measuring state of the asset of object and the evolving state of the digital avatar representation.

SUMMARY OF THE INVENTION

It is an object of the invention to allow for systematic capturing, measuring, quantifying, and forward-looking generating of appropriate risk and risk accumulation measures of physical real-world assets and objects based on physical measuring parameter values and data. Further, the system should be able to connect directly to the core flow of data of the present digital society e.g. using wearables, quantified-self, Internet of Things, smart cities, and industry 4.0 technologies, etc.) by providing a new technology for automated digital risk assessment and forecasting platforms. It is a further object of the invention to allow ensuring the accumulation of quality data which is critical for understanding, identifying, and developing more precise technical instruments and systems to monitor and assess occurrence probabilities and events risks in the age of big data, industry 4.0 and broad mobile internet connectivity e.g. 5G data networks, where the increased bandwidth enables machines, robots and other assets or objects with a high sensory environment, as smart homes and smart cities to collect and transfer more data than ever. The invention should thus be scalable, and the used simulation technics should be easily accessible to the physical assets' analytics. The invention should in particular allow for a normalization of the used risk factors and measuring values. Further, the invention should be easily integratable in other processes, productions chains or risk assessment and measuring systems. Finally, the invention should be enabled to use data and measuring parameter values from multiple heterogeneous data sources, inter alia from IoT sensory. The probability measures and risk forecasts should allow to capture various device and environmental structures, providing a precise and reproducible measuring of risk factors, and allowing to optimize associated event occurrence impacts of the captured risk events.

According to the present invention, these objects are achieved particularly through the features of the independent claims. In addition, further advantageous embodiments follow from the dependent claims and the description.

According to the present invention, the abovementioned objects are particularly achieved by the digital platform for avatar measurements of evolving risk-based real-world measuring parameters, the digital platform comprising at least one input device or measuring sensor associated with a specific physical or intangible real-world asset or living object to be monitored, in that the digital platform comprises a data store storing modular digital assets/objects elements each representing a plurality of subsystems of the real-world asset or object for the assembly of a digital twin representation of the physical or intangible real-world assets or living objects, wherein the modular digital assets or objects elements are selectable to be assembled to said digital twin representation from the data store based on captured structural, operational and/or environmental parameters by means of the digital platform, in that by means of the at least one input device or sensor associated with the twinned physical asset or object, structural, operational and/or environmental status parameters of the real-world asset or object are measurable, and transmittable to the digital platform, to be associated to the digital twin representation, wherein the values of the status parameters associated with the digital twin representation are dynamically monitored and adapted based on the transmitted parameters, and wherein the digital twin representation comprises data structures representing states of each of the plurality of subsystems of the real-world asset or object holding the parameter values as a time series of a time period, in that, by means of the digital platform, data structures representing future states of each of the plurality of subsystems of the real-world asset or object are generatable as value time series over a future time period based on an application of simulations using cumulative damage models, the cumulative damage models generating the effect of the operational and/or environmental asset or object parameters on the twinned real-world asset or object of the future time period, and in that, by means of the digital platform, the digital twin representation is analyzable providing a measure for a future state or operation of the twinned real-world asset or object based on the generated value time series of values over said future time period, the measure being related to the probability of the occurrence of a predefined event to the real-world asset or object.

In an embodiment variant, the control of an operation or status of the real world asset or object is optimized or adjusted to predefined operational and/or status asset or object parameters of the specific real-world asset or object based on the provided measure for a future state or operation of the twinned real-world asset or object and/or based on the generated value time series of values over said future time period, wherein in case of an optimized control of operation, the optimized control of operation is generated to jointly and severally increase the specific operating performance criteria in time and future of the real-world asset or object or decrease a measure for an occurrence probability associated with the operation or status of the real-world asset or object within a specified probability range.

Further, the decrease of the measure for an occurrence probability associated with the operation or status of the real-world asset or object can be based on a transfer of risk to an automated risk-transfer system controlled by the digital platform, wherein values of parameters characterizing the transfer of risk are optimized based on said measure for a future state or operation of the twinned real-world asset or object and/or based on the generated value time series of values over said future time period. In order to optimize the status of the real-world asset or object or the probability of an occurrence of a predefined risk event, an optimizing adjustment of at least a subsystem of the real-world asset of object can be triggered by means of the digital platform. The triggering by means of the digital platform can e.g. be performed by electronic signal transfer. Based on the measure for a future state or operation of the twinned real-world asset or object, a forecasted measure of an occurrence probability of one or more predefined risk events impacting the real-world asset or object can be generated by propagating the parameters of the digital twin representation in controlled time series.

As a further embodiment variant, the operational and/or environmental parameters can e.g. comprise endogen parameters, whose values are determined by the real-world asset or object, and/or exogen parameters, whose values origin from and are determined outside the real-world asset or object and are imposed on the real-world asset or object. The digital platform can e.g. comprise associated exteroceptive sensors or measuring devices for sensing exogen environmental parameters physically impacting the real-world asset or object and proprioceptive sensors or measuring devices for sensing endogen operating or status parameters of the real-world asset or object. The sensors or measuring devices can e.g. comprise interfaces for setting one or more wireless or wired connections between the digital platform and the sensors or measuring devices, wherein data links are settable by means of the wireless or wired connections between the digital platform and the sensors or measuring devices associated with the real-world asset or object transmitting the exogen and endogen parameters measured and/or captured by the sensors or measuring devices to the digital platform.

As another embodiment variant, the digital platform can e.g. comprise and trigger an automated expert system of the digital platform by means of electronic signal transfer, wherein the digital platform triggers the transmission of a digital recommendation to a user interface generated by the expert system of the digital platform based on the measured value of the measure for a future state or operation of the twinned real-world asset or object and/or the measured probability of the occurrence of a predefined physical event to the real-world asset or object, and wherein the digital recommendation comprises indications for an optimization of the real-world asset or object or adaption of the structural, operational and/or environmental parameters.

BRIEF DESCRIPTION OF THE DRAWINGS

The present invention will be explained in more detail below relying on examples and with reference to these drawings in which:

FIGS. 3 and 4 show block diagrams illustrating schematically an exemplary digital risk twin, which can be made available throughout the entire lifecycle of the real-world asset 31/32 or object 33 and/or digital platform 1 through its structure, as shown in FIGS. 3 and 4. FIG. 3 shows the digital asset/object replica 48, the digital twin 47, the digital ecosystem replica 46, the digital risk robot 46 and the digital twin 4 with its optional artificial intelligence 45 of a physical entity 3 in the inventive digital platform 1. In the digital platform 1 and digital twin 47, respectively, each physical asset/object 3 comprise its digital modelling structures 481, 482, 483, ..., 48i and data. These modelling structures 481, 482, 483, ..., 48i and data combined form a digital asset/object replica 48 of an asset/object 3. The digital asset/object replica 48 is then equipped with the three characteristics (1) simulation 471, (2) synchronization 472 with the physical asset/object 3, (3) active data acquisition 473, to form the digital twin 47. The digital risk twin 4 consist of all characteristics of the digital twin 47 as well as a digital risk robot 45 layer and optionally the artificial intelligence layer 41 to realize an autonomous digital platform 1. The digital risk robot 45 layer consists of its own digital modelling structures 461, 462, 463 ..., 46i and data, where these modelling structures 461, 462, 483, ..., 46i and data combined form a digital ecosystem replica 48 of the ecosystem 5 comprising the environmental interacting factors/entities and the interaction to other real-world assets/objects 3. The digital risk twin 4, realized as an intelligent digital risk twin, can therefore implement machine learning algorithms on available models and data of the digital twin 47 and the digital risk robot 45 to optimize operation as well as continuously test what-if-scenarios, used for predictive maintenance and an overall more flexible and efficient production through plug and produce scenarios. Having an intelligent digital risk twin 4 expands the digital risk robot 45 with self-x capabilities such as self-learning or self-healing, facilitating its inner data management as well as its autonomous communication with other digital risk twins 4.

DETAILED DESCRIPTION OF THE PREFERRED EMBODIMENTS

Figure 1:
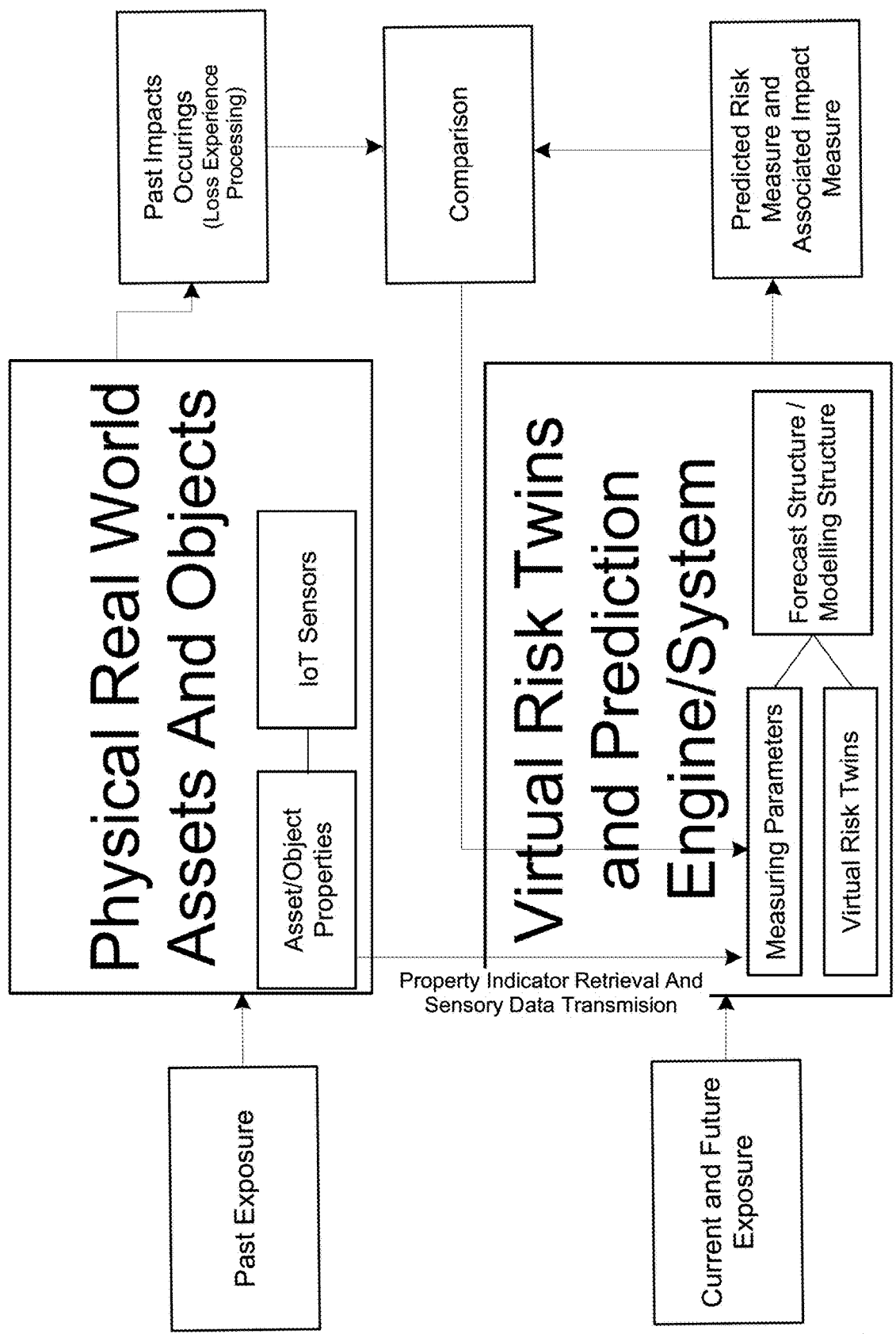
FIGS. 1 and 2 show block diagrams, schematically illustrating the basic structure comprising three main parts: the predicting digital risk twin structure, the properties indicator retrieval and the impact experience processing. The virtual risk twin structure allows to forecast quantitative risk measures and expected impact/loss measures from the digital risk twins using characteristic technical main elements, namely the digital risk twin structure with the simulation and synchronization means and the IoT sensory providing the constant real-world streaming linkage and connection (c.f.
Figure 2:
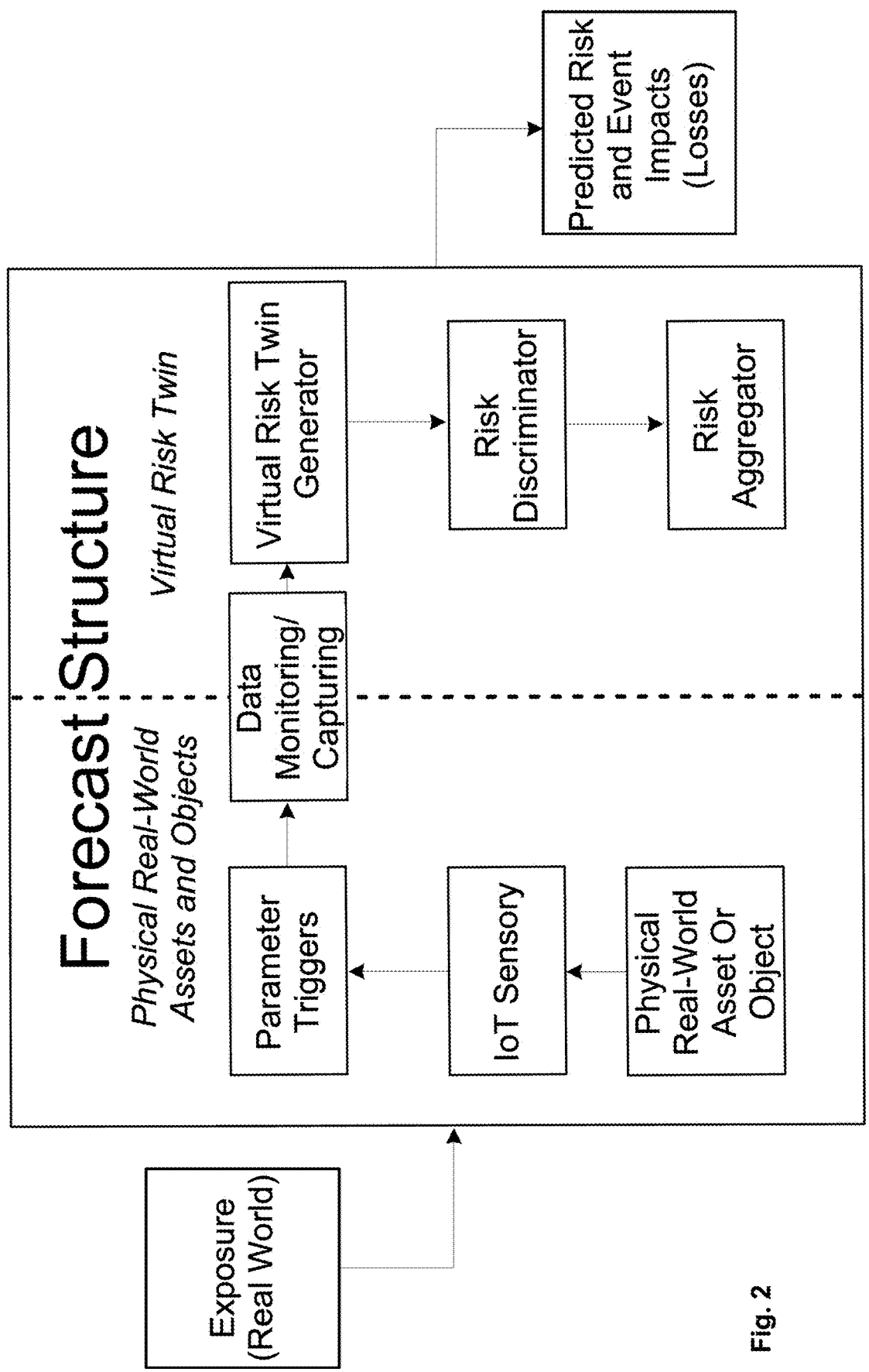

FIGS. 1-4 schematically illustrate an architecture for a possible implementation of an embodiment of the inventive digital platform 1 for avatar measurements of temporally evolving risk-based real-world measuring parameters. The digital platform 1, at least partially realized as an automated, autonomous operating, electronic, digital cyber-physical production system, comprises at least one data-capturing device or measuring sensor 2 associated with a specific physical or intangible real-world asset 3,31/32 or living object 3,33 to be monitored. The data-capturing devices and/or measuring sensors 2, in particular, can comprise IoT sensory and digital sensory networks with appropriate controls, sensors and other devices that make up the digital sensory network. Such sensory network allow seamlessly collecting and communicating data to enable the inventive digital platform 1. Thus, the physical real-world asset 31/32 or living object 33 that is to be twinned is fitted with sensors that measures the desired parameters and forwards them to the connected digital platform 1. Sensory and tracking technology may create real-time streams of measuring data with a predictive potential. The appropriate wearables, trackers, smart home devices and other sensors can so create a constant stream of evolving data that allow to track the evolution of the twinned asset or object 3. Granular streams of data from the used sensory and tracking technology can e.g. be molded into a single digital twin representation 4 by using analytical capabilities of artificial intelligence and machine learning.

The digital twin representation 4 and the digital platform 1, respectively, is based on three technical core characteristics, namely (i) synchronization means for synchronization with the real world asset or object 3, (ii) active data measuring and acquisition from the real environment and/or the real world asset or object 3 and forecast and simulation means giving or forecasting the internal and/or external development of the measuring parameters associated with the twinned system 3 and/or providing the status and/or emerging risk measures associated with the twinned system 3. In addition and at least as an embodiment variant, the digital twin is realized as an intelligent digital twin, wherein the digital platform 1 and/or the digital twin representation include the characteristics of artificial intelligence or other machine learning structures. To realize the proposed architecture for the digital platform 1, several techniques, e.g. Anchor-Point method, methods for heterogeneous data acquisition and data integration or agent-based method for the development of a co-simulation between different digital twin representation, especially for the digital risk twin part, can be implemented. As mentioned above, the digital platform is realized at least partially, as a cyber-physical system, i.e. as an integration of sensor and measuring technology, digital data and cyber methods with physical processes. Embedded computers and networks monitor and control the physical processes, usually with feedback loops, where physical processes affect computations and vice versa.

According to the present invention, the digital twin 4 is a victual representation of a physical asset of object 3 in the digital platform 1, i.e. in the cyber-physical production system, enabled of mirroring its static and dynamic characteristics within certain environmental conditions, i.e. condition parameter settings. The digital platform contains and maps various digital modules to each physical assets or objects 3, of which some are executable, as e.g. simulation or forecast modules. However, not all module are executable, which technically, inter alia, means that the digital twin representation according the present invention is more than just a simulation of a physical asset or object 3. According to the invention, an asset or object 3 can be an entity that already exists in the real world or can be a representation of a future entity that will be constructed or still have to be born. It is important to understand, that the digital twin representation 4 of the present invention can be realized a composite of many individual digital twin representations 4. These digital twin representations 4 communicate with each other by means of the digital platform 1 and are enabled exchange data and information. A digital twin representation 4 of the digital platform 1 can simulate and test various scenarios for reconfiguration of the digital platform 1, such as reliability, energy consumption, process consistency, ergonomics, logistics, virtual commissioning, etc. The different simulation modules interacting with each other, form a co-simulation of the entire system and show the characteristics of the digital platform 1 e. g., the behavior, function, etc. By reconfiguration is meant a modification of parts of an already existing and operating digital platform 1 to meet new requirements, typically arising or emerging from the stream of sensory data measured in the real-world of the physical twin 3 in order to achieve convergence in the parallel development. It is important to understand, that the digital platform 1 as a cyber-physical production system is neither a purely physical object nor a purely virtual object, since its virtual digital core, i.e. the digital twin structure 4 only exist in its dependency to the real-world, physical object 3 and its constant link and sensory data streaming connection to the real-world physical object 3, connecting the digital twin 4 to the twinned real-world object 3 like an unborn child to its mother through the live-spending umbilical cord.

The digital platform 1 comprises a data store 10 with stored modular digital assets/objects elements 101, ..., 105 each representing a plurality of subsystems 41 of the real-world asset or object 3 for the assembly of a digital twin representation 4 of the physical or intangible real-would assets or living objects 3. The data store 10 can be realized as an electronic repository for persistently storing and managing collections of data which include not just repositories like databases, but also simpler store types such as simple files, etc. The data store can accommodate data in any known formats and data structures and in various formats and data structures at the same time. Thus, the data store is more than a library, since it can technically represent a "data lake" or a "data ocean". Under databases, it is understood herein a series of bytes that is managed by a database management system (DBMS), while a file is understood as a series of bytes that is managed by a file system. Thus, any database or file is a series of bytes that, once stored, can constitute a data store 10, as referred herein. As such, the data store 10 technically provides the basis to hold and abstract and collections of constructive data inside the respective digital platform 1 to build up the digital twin representation 4. The data store 10 can also comprise data lake repositories or data ocean repositories of data holding data in its natural/raw format, e.g. object BLOBs (Binary Large OBject) or files, where a BLOB is understood herein as a collection of binary data stored as a single entity in a database management system. BLOBs can comprise images, audio or other any multimedia objects, or even binary executable code stored as a blob. The modular digital assets or objects elements 101, ..., 105 are selected and assembled to said digital twin representation 4 from the data store 10 based on captured structural 421, operational 422 and/or environmental 423 property parameters 42 by means of the digital platform 1.

The invention provides the technical structure for making assessments and/or predictions regarding the operation or status of a real world physical system 3, such as industrial plants, e.g. comprising electro-mechanical system, or living objects 3, e.g. human being with health condition. The predicted measures may, inter alia, be based on aging process modelling. For example, it may be helpful to predict the remaining life of a technical system, such as an aircraft engine or a mill plant, to help plan when the system should be replaced or when a certain risk measure for a possible loss exceeds a certain threshold value. An expected life-time or risk measure of a system may be estimated by a prediction or forecast process involving the probabilities of failure of the system's individual components, the individual components having their own reliability measures and distributions, or the probability of an impact of an occurring risk event.

Digital models and modelling executables contain a digital representation of dynamic processes affecting the asset or object or elements of the asset/object, thereby providing its development to future time-frames. It can be distinguished between digital knowledge models (representing the current understanding about relationship of things in the real world. They are often described as digital knowledge graphs, digital risk models (hazard models, rating models, pricing and price development models, etc.) and machine learning model modules that can help to detect non-linear patterns in data to extrapolate the ability to predict outcomes. Having involved a plurality of measuring devices and sensors, the present system is able to constantly or periodically monitor and trigger multiple components of a system, real-world asset or living object 3, each having its own micro-characteristics and not just average measures of a plurality of components, e.g. associated with a production run or slot. Moreover, it may be possible to very accurately monitor and continually assess the health of individual technical components of the physical real-world asset 31/32 or parts of the body of the living object 33, predict their error-proneness, vulnerability, health-status or remaining live-time, and consequently assess and forecast health measures, health risk measures and remaining life-time. Thus, the system provides a significant advance for example for applied prognostics and risk measuring. It further provides the technical basis for discovering and monitor real-world assets and objects 3 in an accurate and efficient manner allowing, inter alia, to precisely trigger risk measures, or in the context of production systems to reduce unplanned, losses, break downs or at least the associated down time for complex systems. The inventive system 1 also allows to achieve a nearly optimal control of a twined physical system if the relevant sensory data can by measures and assessed, if the life of the parts and degradation of the key components can be accurately determined or, in case of living objects 33, if the health status and condition of the relevant organs can be correctly measured. According to the present invention, these forecast measures are provided by a digital twin 4, in particular a digital risk twin, of a twinned physical system 3.

By means of the at least one input device or sensor 2 associated with the twinned physical asset or object 3, structural 431, operational 432 and/or environmental 433 status parameters 43 of the real-world asset or object 3 are measured and transmitted to the digital platform 1. The status parameters 43 are assigned to the digital twin representation 4, wherein the values of the status parameters 43 associated with the digital twin representation 4 are dynamically monitored and adapted based on the transmitted parameters 43, and wherein the digital twin representation 4 comprises data structures 44 representing states 441 of each of the plurality of subsystems 41 of the real-world asset or object 3 holding the parameter values as a time series of a time period.

Some embodiments are directed to an Internet of Things associate to facilitate implementation of a digital twin of a twinned physical system. For these variants, the IoT associate may include a communication port to communicate with at least one component, the at least one component comprising a sensor 2 or an actuator associated with the twinned physical system 3, and a gateway to exchange information via the IoT. The digital platform 1 and local data storage, coupled to the communication port and gateway, may receive the digital twin 4 from the data store via the IoT. The digital platform 1 may be programmed to, for at least a selected portion or subsystem 34 of the twinned physical system 3, execute the digital twin 4 in connection with the at least one component and operation of the twinned physical system 3.

The structural and/or operational and/or environmental status parameters 43 can e.g. comprise endogen parameters, whose values are determined by the real-world asset or object, and/or exogen parameters, whose values origin from and are determined outside the real-world asset or object and are imposed on the real-world asset or object. The digital platform 1 can e.g. comprise associated exteroceptive sensors or measuring devices for sensing exogen environmental parameters physically impacting the real-world asset or object and proprioceptive sensors or measuring devices for sensing endogen operating or status parameters of the real-world asset or object. The sensors or measuring devices can e.g. comprise interfaces for setting one or more wireless or wired connections between the digital platform 1 and the sensors or measuring devices 2, wherein data links are settable by means of the wireless or wired connections between the digital platform 1 and the sensors or measuring devices 2 associated with the real-world asset or object 3 transmitting the exogen and endogen parameters measured and/or captured by the sensors or measuring devices 2 to the digital platform 1.

By means of the digital platform 1, data structures 44 for the digital twin representation 4 representing future states 441 of each of the plurality of subsystems 41 of the real-world asset or object 3 are generated as value time series over a future time period based on an application of simulations using cumulative damage models, the cumulative damage models generating the effect of the operational and/or environmental asset or object parameters on the twinned real-world asset or object 3 of the future time period. Models, as understood herein, technically contain a digitized, formalized representation of the known time-related influences and damage mechanisms. Concerning the digital engineering, the cumulative damage models can comprise digital knowledge models for the knowledge engineering, time-dependent risk models and machine learning models that are able to detect non-linear patterns in data to extrapolate the ability to predict outcomes, where the digital knowledge models represent and capture the relationship of the objects in the real world, e.g. described as knowledge graphs. Knowledge graphs are structured knowledge in a graphical representation, which can be used for a variety of information processing and management tasks such as: (i) enhanced (semantic) processing such as search, browsing, personalization, recommendation, advertisement, and summarization, 2) improving integration of data, including data of diverse modalities and from diverse sources, 3) empowering ML and NLP techniques, and 4) improve automation and support intelligent human-like behavior and activities that may involve robots. For example, for a micromechanical device, a micromechanics modelling can be used that includes the internal and external effects on the device can be used in a cumulative damage scheme to predict the time-dependent fatigue behavior. Parameters can be used to model the degradation of the device under fatigue loading. A rate equation that describes the changes in efficiency as a function of time cycles can be provided using experimentally determined reduction data. The influence of efficiency parameters on the strength can be assessed using a micromechanics model. The effect of damage probability measures on the device can be provided by solving a boundary value problem associated with the particular damage mode (e.g. transverse matrix cracking). Predictions from such technical modelling can be back-checked and compared with experimental data, e.g. if the predicted fatigue life and failure modes of the device agree very well with the experimental data. The modelling of the present invention (especially machine learning and risk modelling, i.e. modelling of probability measures of future occurring events) leverage time-series data in order to build a view from the past that can be projected towards the future.

All mentioned prediction and modelling modules (especially risk-based and/or machine learning) leverage time-series data in order to build a view from the past that can be projected towards the future. This also applies to establish frequency and severity measures of events that can be used for risk-based purposes. A risk measure or risk-exposure measure is understood herein as the physically measurable probability measure for the occurrence of a predefined event or development. As mentioned, historical measuring data are also fundamentals to establish frequency and severity of events that can be used for risk measures. Historical data can be used in all areas, like general dimensions (e.g. measuring weather, GDPs (Gross Domestic Products), risk events) as well as more risk-transfer related (e.g. measuring economic losses, insured losses). In the above example of the micro-mechanical device, the historical data can, inter alia, be also be weighted by experimental step-stress test data to verify the cumulative exposure/damage modelling structure.

By means of the digital platform 1, the digital twin representation 4 is analyzed providing a measure for a future state or operation of the twinned real-world asset or object 3 based on the generated value time series of values over said future time period, the measure being related to the probability of the occurrence of a predefined event to the real-world asset or object 3. The digital twin 4 of twinned physical system 3 can, according to some embodiments, access the data store, and utilize a probabilistic model creation unit to automatically create a predictive model that may be used by digital twin modeling processing to create the predictive risk measure.

As used herein, the term "automatically" may refer to, for example, actions that can be performed with little or no human intervention. As further used herein, devices, including those associated with the digital platform 1 may exchange information via any communication network which may be one or more of a Local Area Network ("LAN"), a Metropolitan Area Network ("MAN"), a Wide Area Network ("WAN"), a proprietary network, a Public Switched Telephone Network ("PSTN"), a Wireless Application Protocol CWAP") network, a Bluetooth network a wireless LAN network, and/or an Internet Protocol ("IP") network such as the Internet, an intranet, or an extranet. Note that any devices described herein may communicate via one or more such communication networks. The digital risk twin 4 of the twinned physical system 3 can e.g. store information into and/or retrieve information from various data sources, such as the sensors 2, the data store etc. The various data sources may be locally stored or reside remote from the digital twin 4 of the twinned physical system 3.

By means of the digital platform 1, the control of an operation or status of the real world asset or object 3 can be optimized or adjusted to predefined operational and/or status asset or object parameters of the specific real-world asset or object 3 based on the provided measure for a future state or operation of the twinned real-world asset or object 3 and/or based on the generated value time series of values over said future time period. In case of an optimized control of operation, the optimized control of operation is generated to jointly and severally increase the specific operating performance criteria in time and future of the real-world asset or object or decrease a measure for an occurrence probability associated with the operation or status of the real-world asset or object within a specified probability range. The decrease of the measure for an occurrence probability associated with the operation or status of the real-world asset or object 3 can e.g. be based on a transfer of risk to an automated risk-transfer system controlled by the digital platform, wherein values of parameters characterizing the transfer of risk are optimized based on said measure for a future state or operation of the twinned real-world asset or object 3 and/or based on the generated value time series of values over said future time period. In order to optimize the status of the real-world asset or object 3 or the probability of an occurrence of a predefined risk event, an optimizing adjustment of at least a subsystem 34 of the real-world asset of object 3 can e.g. be triggered by means of the digital platform 1. The triggering by means of the digital platform 1 can e.g. be performed by electronic signal transfer.

As variant, the digital twin 4 of the twinned physical system 3, i.e. the digital virtual replicas are constantly updated and analyzed by measuring data from their real counterparts, i.e. the twinned physical system or object 3 and from the physical environment that surrounds them in their real physical world. The digital platform 1 is able to react on the digital twin 4 and it can run analysis related to historical data, current data and forecasts. It is able to predict what will happen in each case and the associated risk, and thus be able automatically propose actions and provide appropriate signaling. Even the virtual twin itself or the digital platform 1, respectively, can act, when technically realized as such, on the technical means of its real-world twin 3, given that the two are linked by appropriate technical means. For example, by electronically sensing and triggering the occurrence of one or more specified threshold values emerging from or otherwise popping up at the digital twin 4 by means of a trigger or control module of the digital platform 1, electronic signaling can be generated by means of a signaling module and a data-transmission interface of digital platform 1, which is transmitted over a data-transmission network to the corresponding technical means or a PLC (Programmable Logic Controller) steering the corresponding technical means of the digital twin 4. In this case, the digital platform 1 is connected via the data-transmission network, which can include a land-based and/or air-based wired or wireless network; e.g., the Internet, a GSM network (Global System for Mobile Communication), an UMTS network (Universal Mobile Telecommunications System) and/or a WLAN (Wireless Local Region Network), and/or dedicated point-to-point communication lines. As the measuring sensors at the real-world asset or object 3, the corresponding technical means can be connected to the digital platform by telematics devices, allowing a continuous monitoring and control of the real-world twin 3. The corresponding technical means of the real-world twin 3 can e.g. comprise switches (e.g. on/off switches) activating or deactivating the associated technical means or the operation of the real-world asset or object 3 to prevent damage or loss at the real-world asset or object 3. In case of a living real-world object 3, the corresponding technical means can e.g. comprise electronic alarm means signaling an imminent occurrence of a damage or loss event to the living object 3 or emergency systems, as e.g. a heart attack or stroke. The PLCs, as mentioned above, are enabled to electronically control and steer appropriate technical means of the real-world asset or object 3, and can range from small modular devices with tens of inputs and outputs (I/O), in a housing integral with the processor, to large rack-mounted modular devices with a count of thousands of I/O, and which are often networked to other PLC and SCADA (Supervisory Control And Data Acquisition) systems. The PLCs can be designed for multiple arrangements of digital and analog I/O, extended temperature ranges, immunity to electrical noise, and resistance to vibration and impact. Executable program codes to control a possible machine operation at the real-world asset 3 can e.g. be stored in battery-backed-up or non-volatile memory.

The present invention has inter alia the advantage, that the digital platform 1 is consolidated in Industry 4.0 technology, especially providing new technical advantages in the automation of risk-transfer and insurance technology, in particular automated risk control and management systems. For example in the case of automated means for risk-transfer in the context of associated vehicles or houses, their nowadays increasing hyper-connection will contribute to the construction of the digital twins 4 by means the digital platform 1, so that the platform 1 provides new technical ways to generate predictive modelling and offer automated personalized services. Especially, if the subject of the risk-transfer is not a real-world asset 3 but a living object 3, that brings a degree of complexity, where trying to forecast and predict human factors will always involve a considerable margin of error, and the inventive digital platform 1 is able to solve by means of the digital risk twins challenge in the risk-transfer technology, where prior art systems are not able to cope with. As an increasing amount of personal data are generated e.g. through smartphones, fit-bits or other devices e.g. in smart homes, for example, prior art systems are, despite the availability of more and more data, not able to make them coherent and to translate them into probable behavior (and its associated risk measures). Thus, the inventive system 1 is able to play a key role that allows a more direct and personalized relationship with the living object 3 (i.e. the risk-transfer client) and is able to provide a critical technical role as new intermediary between data providers and risk-transfer systems, specialized in interpreting the accumulating big data of risk-transfer customers by linking it to the generation of appropriate digital twins 4.

As an embodiment variant, based on the measure for a future state or operation of the twinned real-world asset or object, a forecasted measure of an occurrence probability of one or more predefined risk events impacting the real-world asset or object 3 can e.g. be generated by propagating the parameters of the digital twin representation 4 in controlled time series. As a further embodiment variant, the digital platform can e.g. comprise and trigger an automated expert system of the digital platform 1 by means of electronic signal transfer, wherein the digital platform 1 triggers the transmission of a digital recommendation to a user interface generated by the expert system of the digital platform based on the measured value of the measure for a future state or operation of the twinned real-world asset or object and/or the measured probability of the occurrence of a predefined physical event to the real-world asset or object 3, The digital recommendation comprises indications for an optimization of the real-world asset or object 3 or adaption of the structural, operational and/or environmental status parameters.

Figure 3:
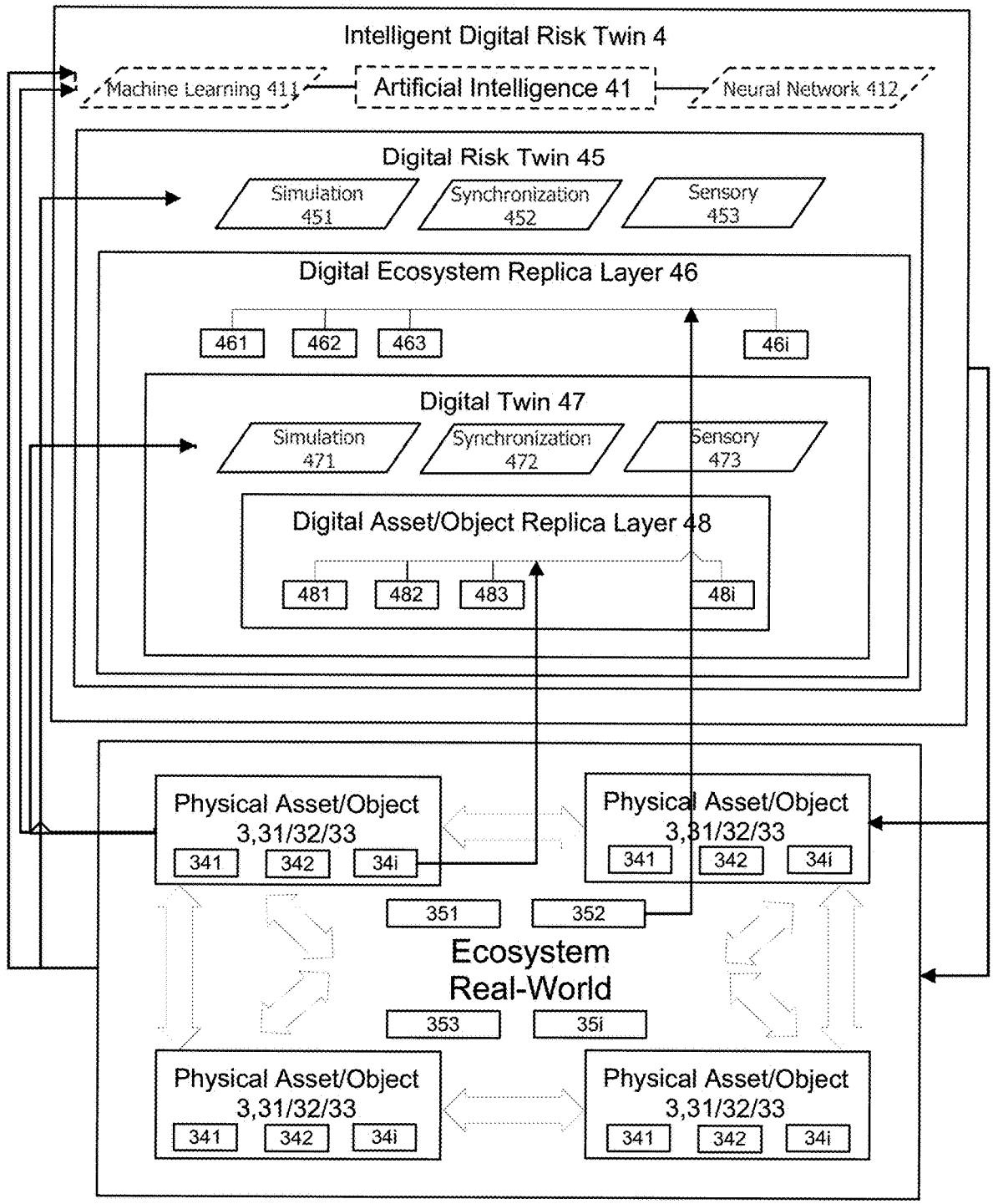
FIGS. 3 and 4).
Figure 4:
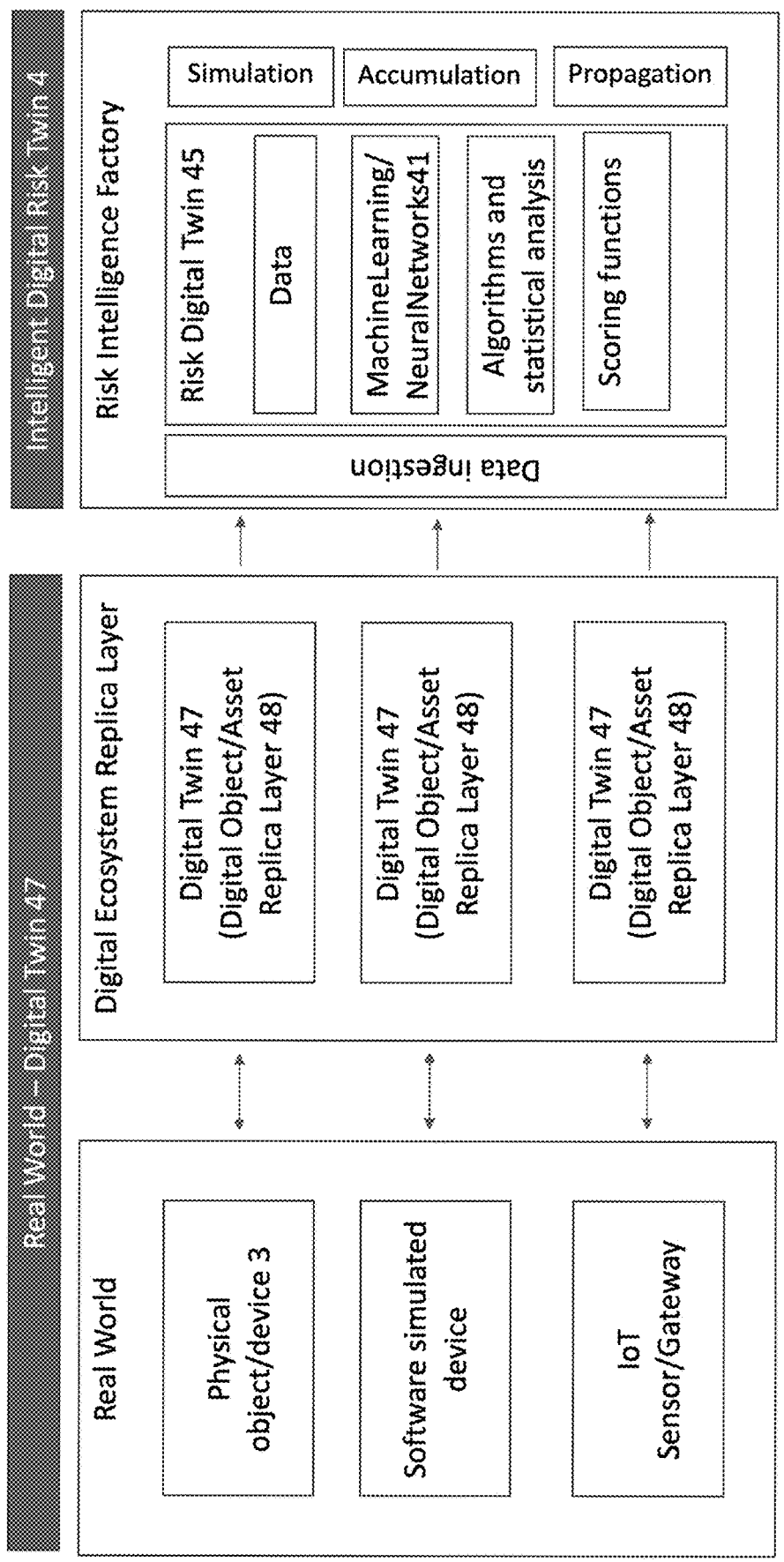
Figure 5:
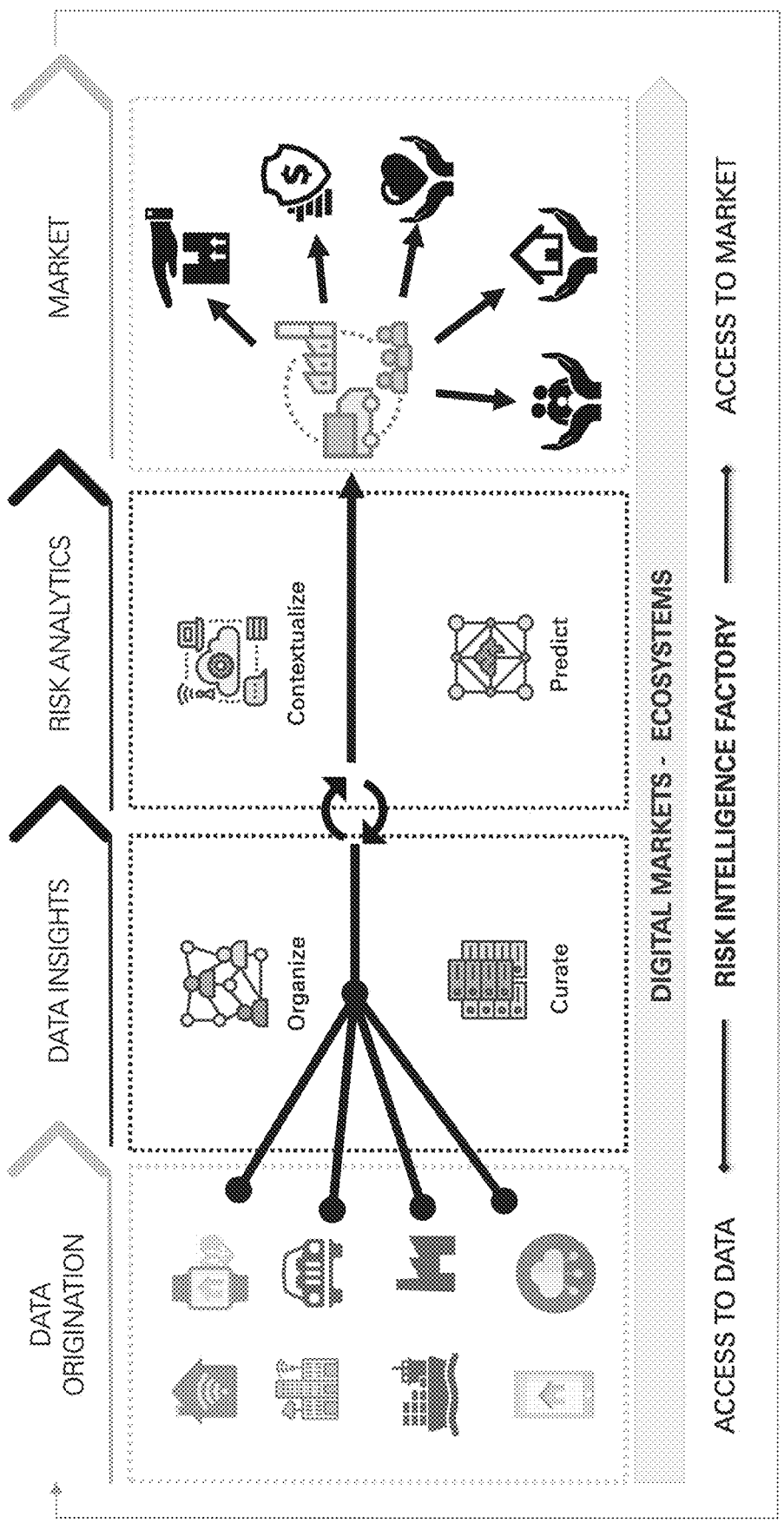
FIG. 5 shows a block diagram illustrating schematically an exemplary value data chain connecting directly to the core flow of data of the digital society (wearables, quantified-self, Internet of things, smart cities, industry 4.0, etc.). The process simplifies risk-transfer technology and extend it with the inventive digital risk twin structure integrated in the digital platform to help the ecosystem understand, measure, prevent and mitigate risks end to end. The digital risk twin structure (indicators, analytics) can be embedded into digital platforms or provided directly through API.
Figure 6:
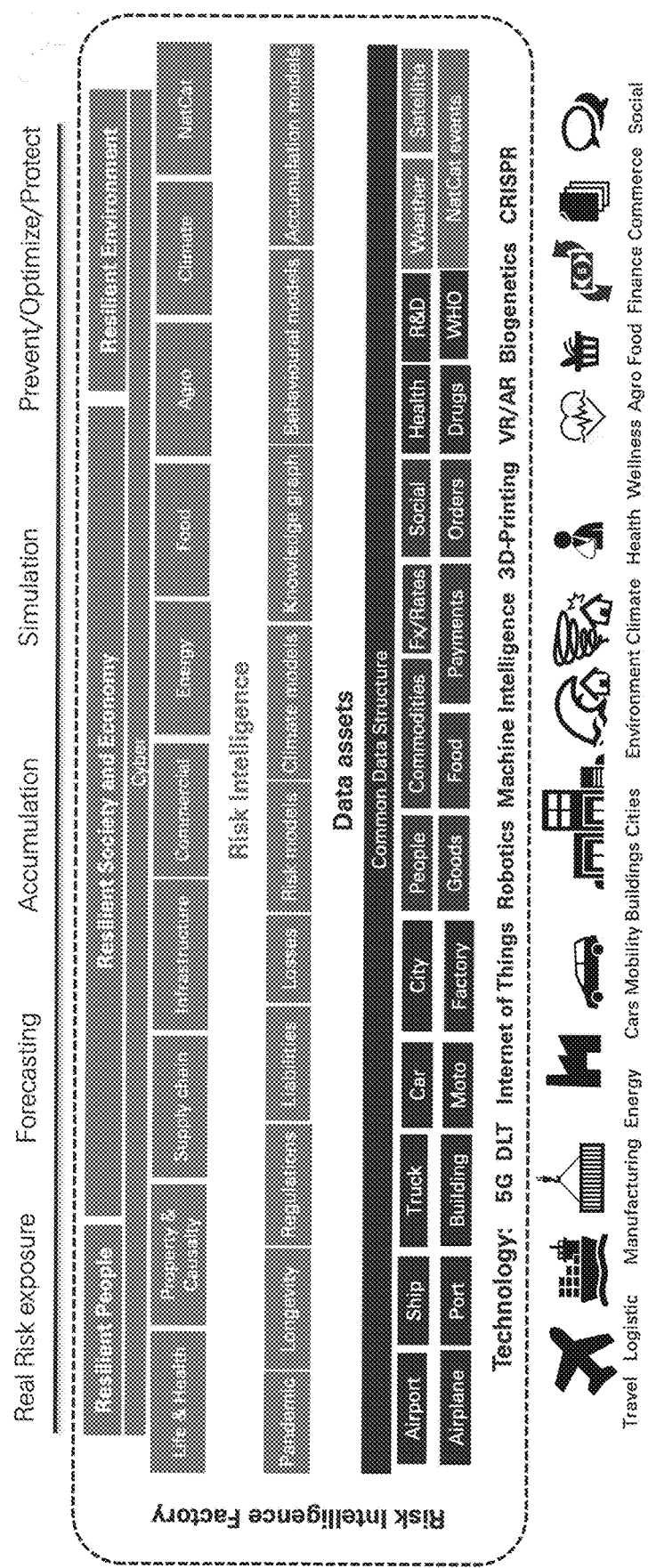
FIG. 6 shows a block diagram illustrating schematically an exemplary realization of the inventive digital risk twin based platform. According to the invention, the digital representation of the risks related to a specific real world asset or object. The invention provides a quantification of risks by appropriate risk measures. This includes risk assessment and risk scoring capabilities. It can also include risk impact measures on a much larger scale (i.e. engine>plant>supply chain). The inventive solution is scalable and can be digitally created/managed. It allows to extend prior technologies for risk based data services and to create easy access to asset related insights/analytics. Further, it provides a normalized use of risk factors and values. Finally, it can be easily integrated in other processes/value chains.

FIGS. 3 and 4 show a more detailed schematic representation of the digital risk twin 4, in particular the digital asset/object replica 48, the digital twin 47, the digital ecosystem replica 46, the digital risk robot 46 and the digital twin 4 with its optional artificial intelligence 45 of a physical entity 3 in the inventive digital platform 1. In the digital platform 1 and digital risk twin 4, respectively, each physical asset/object 3 consists of its digital modelling structures 481, 482, 483, . . . , 48i and associated data and, its digital modelling structures 461, 462, 463, . . . , 46i and associated data. The digital twin 47 with the digital asset/object replica 48 is realized as a continuously updated, digital structure hold by the digital platform 1 that contains a comprehensive physical and functional description of a component or system throughout the life cycle. As such, the digital risk twin 4 provides a realistic equivalent digital representation of a physical asset or object 3, i.e. a technical avatar, which is always in synch with it. It allows to run a simulation on the digital representation to analyze the behavior of the physical asset. Additionally, each digital risk twin 4 of the digital platform 1 can comprise a unique ID to identity a digital risk twin 4, a version management system to keep track of changes made on the digital risk twin 4 during its life cycle, as already describe above, interfaces between the digital risk twins 4 for co-simulation and inter-twin data exchange, interfaces within the digital platform, in which the digital risk twins 4 are executed an/or held, and interface to other digital risk twin for co-simulation. Further aspects of a digital risk twin 4 relate to the internal structure and content, possible APIs and usage, integration, and runtime environment. The aspect of APIs and usage relate to the possible requirements for interfaces of the digital risk twin 4, in particular such as cloud-to-device communication or access authorization to information of the digital risk twin 4. For such integration the system 1 comprises an identification mechanism for unambiguous identification of the real asset/object 3, a mechanisms for identifying new real assets/objects 3, linking them to their digital risk twin 4, and synchronizing the digital risk twin 4 respectively its twinned subsystems with the real asset/object 3, and finally technical means for combining several digital risk twin subsystems into a digital risk twin 4. The ID provides the technical identification of a unique digital risk twin 4 with an real-world asset/object. With the help of this unique ID, the data and modelling structures of the digital risk twin 4 are stored as a module on a database containing all data and information and can be called any time during engineering or reconfiguration. This obviously supports modularity in the context of modular system engineering. A digital risk twin 4 provides the means to encapsulate the subsystems of a real-world asset/object 4. For example, CAD models, electrical schematic models, software models, functional models as well as simulation models etc. Each of these models can e.g. be created by specific means during the engineering process of a digital risk twin 4. An important feature are the interfaces between these means and their models. Tool interfaces can be used to provide interaction between modelling structures. For example, the modelling structures can be updated or reversioned during the entire life cycle or domain-specifically simulated with the aid of different inputs. The digital risk twin 4 of a real-world asset/object 3 should not only contain current modelling structures, but also all generated modelling structures during the entire lifecycle. This, for example, can support efficient engineering during reconfiguration and expandability throughout the lifecycle. Digital risk twin 4 time-series management provides access to all stored versions of the modelling structures and their relations. This allows the old version to be called up any time at the request of an engineer, taking into account the circumstances during engineering or reconfiguration, and to switch to the current version. As describe above, in order to accurately reflect the behavior and current state of the real-world asset/object 3, the digital risk twin 4 must contain current operation data of the asset/object 3. This can be sensor data, which are continuously streamed and recorded, as well as control data, which determines the current status of the real component, also recorded over the entire lifecycle. Finally, as a variant, a co-simulation interface for communication with other digital risk twins 4 can be provided to obtain more precise image of reality. For example, a data exchange can enable multidisciplinary co-simulation in the digital platform 1. This can be used to simulate the process flow of the entire system 1 in the real world.

As discussed above, the digital risk twin 4 can comprise an artificial intelligence layer 41. Such an intelligent digital risk twin 4 rises the system 1 to an complete autonomous level compare to the digital risk robot 45 in the digital platform 1. This allows the digital platform 1 and the digital risk twin 4 to cope with the streaming data amount coming from the measuring devices of the real-world asset/object 3, which can comprise, for example telematic devices of smart homes or smart cities or cars, in particular autonomous car system, in case of a real-world asset 31/32, or in case of a living object, as a human, wearable devices measuring body-related parameters. It is to be noted, that the digital platform 1 may comprise different digital risk twins related to different aspects of a user's life, as e.g. an IoT-based smart-home digital risk twin 4, a telematic-based vehicle digital risk twin 4, and/or a telematic-based body risk twin 4, enabling the system 1 to measure and trigger extended and/or combined risk exposure measures of a certain user. In the context of smart-homes, smart-cities, interconnected cars and the like, interoperability can be achieved either by adopting universal standards for a communication protocol or by using a specialized device in the network that acts like an interpreter among the different measuring and sensory devices and protocols. The interoperability in the context of IoT-based and/or telematics and/or smart wearable devices and big data solutions can so be achieved.

An intelligent digital risk twin 4, using the entire system's actual digital risk twin 45, can be used to realize processes such as optimization of the process flow, automatic control code generation for newly added real-world devices/assets/objects 3 in the context of plug and produce and predictive maintenance using stored operation data in the digital risk twin 4 throughout the lifecycle. To realize this, additional components are required to equip the digital risk twin 4 architecture with intelligence.

As shown in FIG. 3, for such additional components, being the digital replica layers 46/48 modelling comprehension, intelligent digital risk twin algorithms 41 and e.g. extra interfaces for communicating with the physical asset/object 3 are added to the architecture of the digital risk twin 4 to make it self-adaptive and intelligent.

To dynamically synchronize the digital risk twin 4 with the physical asset/object throughout the entire lifecycle of the twin 4, the digital platform 1 and the digital risk twin 4, respectively, comprise the technical means to understand and manage all modelling structures and data. Accordingly, the digital risk twin 4 modelling comprehension in the structure of FIG. 3 fulfills this purpose by storing information of the interdisciplinary modelling structures 46/48 within the digital risk twin 4 and its relations to other digital risk twins 4. The digital risk twin 4 modelling structure is realized with a standardized semantic description of modelling structures, data and processes for a uniform understanding within the digital risk twin 4 and between digital risk twins 4. Technologies to implement such a standardization can, for example, be OPC UA (OPC: Open Platform Communications, UA: Unified Architecture) or OWL (Web Ontology Language of the World Wide Web Consortiums (W3C)).

The autonomous, intelligent digital risk twin 4 comprises two important capabilities regarding the processing of acquired operation data. It applies appropriate algorithms on the data to conduct data analysis. The algorithms extract new knowledge from the data which can be used to refine the modelling structure of the digital risk twin 4 e. g., behavior modelling structures. Thus, the intelligent digital risk twin 4, as embodiment variant, can provide electronic assistance and appropriate signaling e.g. to a worker at a plant to optimize the production in various concerns. Further, an digital risk twin 4 incrementally improves its behavior and features and thus steadily optimize its behavior, as e.g. the mentioned signaling to the worker of the plant. Therefore, dependent on the type of the twinned real-world asset/object 3, the digital risk twin 4 can provide autonomous steering signaling and electronic assistance signaling for different use cases such as process flow, energy consumption, etc.

Concerning co-simulation of different digital risk twins 4, in case of industrial assets 31, an optimized combination and process chain between digital risk twins 4 can e.g. be realized by parameterizing the existing modelling structures in relation to other digital risk twins 4 in a co-simulation environment. Based on the results of this simulative environment, the intelligent digital risk twin 4 triggers a parametrization of physical assets 31. In another example, the time-dependent evolving structure of a digital risk twin 4 is e.g. used to optimize individual parameters of the real-world asset or object 3, i.e. to determine optimal real-world asset's or object's 3 parameters. For example, as a consequence, the amount of degraded products can be minimized leading to an increased quality of a concerned manufacturing process, as e.g. a milling process.

According to another embodiment variant, other artificial intelligence algorithms 41 deal with automated code generation, for example through service-oriented architecture approaches for real machines based on the new requirements. This allows approaches such as plug and process to be realized. Other intelligent algorithms 45 can e.g. provide a simulation-based diagnostic and prediction processing through data analysis and knowledge acquisition, for example in the context of desired predictive maintenance. Such machine-based intelligence 45 can e.g. comprise algorithms to product failure analysis and prediction, algorithms to optimization and update of process flow, algorithms for generating a new control program for the twinned real-world asset 31 based on new requests, algorithms for energy consumption analysis and forecast etc. As an embodiment example of autonomous analysis of a digital risk twin 4, an example for a production plant as real-world asset 31 is provided in the context of historical process data of such production plants to predict future maintenance intervals or to maximize the availability of the plant (i.e. predictive maintenance signaling). To extract a model from or find correlations within operation data, unsupervised learning techniques such as k-means clustering or auto encoder networks with LSTM cells can be applied on time series data. In case of k-means clustering with sliding windows, the learned time-sensitive cluster structure is used as model for the system behavior. This circumstance allows for instance the detection of anomalies and the prediction of failures. To do so, a distance metric that considers the current point in time is applied on a test data set of currently acquired data and the cluster centers of the trained model. Anomalies in the test data set are detected by defined time-dependent limit violations to the cluster centers as well as the emergence of new, previously non-existent clusters. Thus, the slinking emergence of failure can be predicted based on the frequency of anomaly occurrences and their intensity of deviation.

As a further embodiment example, the digital risk twin 4 can e.g. be applied to automated risk-transfer and risk exposure measuring systems. Also in this example, the digital representation of the risks related to a specific real world asset or object 3. The digital platform allows the generation of signaling giving a quantification measure of risks, e.g. with appropriate numbers and graphs. The digital platform 1 thus comprises automated risk assessment and measuring and risk scoring capabilities based on the measured risks, i.e. probability measures for the occurrence of a predefined risk event with an associated loss. The digital platform 1 is able to measure the risk impact on a much larger scale (i.e. engine>plant>supply chain) by means of the digital risk twin 4. The digital risk twin 4 has further the advantage that it can be completely digitally created/managed. It allows to extend the risk-transfer technology for risk based data services, and provides an easy access to asset/object 3 related insights/analytics by means of the digital risk twin 4. Further, it allows to provide normalization of risk factors and values, as described above, and is easy to integrate in other processes/value chains.

The twinned real world entity can be a physical or intangible asset 31/32 or a living object 33, e.g. a human being 331 or an animal 332. The complete digital platform 1 can be used on digital twins (IoT) and appropriate data feeds. The digital platform 1 can e.g. be realized in the sense of a risk intelligence factory creating the digital risk twin 4 by applying a company's intelligence (risk, actuarial, Machine Learning, etc.) to data assets. In contrast to the digital twin 47, which uses data from IoT sensors, physical modelling structures of the real-world device/asset/object 3 providing time-dependent measures for the performance and/or status etc., the digital risk twin 45 captures and measures data from multiple sources comprising ecosystem measuring parameters and involves a risk modelling structure of the real-world asset/object 3 and the environment, which allow to effectively measure and trigger risk-related factors, as e.g. exposure measures or occurrence probabilities of risk-events or impact measures under the occurrence of a certain event with a certain strength or physical characteristic. Thus, it allows inter alia to effectively optimize and minimize risk impacts, respectively.

LIST OF REFERENCE SIGNS

1 Digital Platform
10 Data Store
101, . . . , 105 Modular Digital Assets/Objects Data Elements
2 IoT Sensory (input devices and sensors)
3 Real-world Asset or Object
31 Physical Asset
32 Intangible Asset
33 Living Object
331 Human Being
332 Animal
34 Subsystems of the Real-world Asset or Object
341, 342, 343, . . . , 34$i$ Subsystems 1, . . . , i
35 Subsystems and Components of the Ecosystem
351, 352, 353, . . . , 35$i$ Subsystems 1, . . . , i
4 Digital Risk Twin (autonomous)
41 Digital Intelligence Layer
411 Machine Learning
412 Neural Network
42 Property Parameters of Real-World Asset or Object
43 Status Parameters of Real-World Asset or Object
431 Structural Status Parameters
432 Operational Status Parameters
433 Environmental Status Parameters
44 Data Structures Representing States of Each of the Plurality of Subsystems of the Real-World Asset or Object
45 Digital Risk Twin
451 Simulation
452 Synchronization
453 Twin Linking: Sensory/Measuring/Data Acquisition
46 Digital Ecosystem Replica Layer
461, 462, 463, . . . , 46$i$ Virtual Subsystems of Twinned Ecosystem
47 Digital Twin
471 Simulation
472 Synchronization
473 Twin Linking: Sensory/Measuring/Data Acquisition
48 Digital Asset/Object Replica Layer
481, 482, 483, . . . , 48$i$ Virtual Subsystems of Twinned Real-World Asset/Object
5 Ecosystem—Environment—Interaction between Real-world Assets/Objects

The invention claimed is:

1. A method for a digital device to measure temporally evolving parameters, the method comprising:
selecting, by circuitry of the digital device, object elements stored in a storage of the digital device, and assembling the selected object elements;
measuring, by a plurality of sensors of the digital device, at least one parameter of structural parameter, operational parameter, and environmental status parameter, the at least one parameter being associated with a physical object represented by the assembled object elements, wherein the assembled object elements include data structure representing states of subsystems of the physical object, and the data structure holds a value of the at least one parameter;
generating the data structure based on simulated effects of the at least one parameter on the physical object;
analyzing the physical object based on the generated data structure for a future time period;
predicting, based on analysis, an estimated probability of an occurrence of a predefined physical event with a certain strength or physical characteristic physically impacting the physical object by associated losses or predicting, based on the analysis, the probability of the occurrence of a predefined state to the physical object in the future time period, wherein a physically measurable probability for the occurrence of the predefined physical event is established based on the measured at least one parameter and based on frequency and severity of historical measuring data of the predefined physical event by a predicting machine learning module using measured historical timeseries data; and
triggering an adjustment of a subsystem of the physical object via an electronic signal transfer to optimize a status of the physical object based on the estimated probability of the occurrence of the predefined physical event or the probability of the occurrence of the predefined state to the physical object and the physically measurable probability.

2. The method according to claim 1, further comprising:
adjusting an operation of the physical object based on the predicted estimated probability of the occurrence of the predefined physical event or the probability of the occurrence of the predefined state to the physical object in the future time period, wherein the operation is adjusted to jointly and severally increase operation performance criteria or decrease the estimated probability of the occurrence of the predefined physical event or the probability of the occurrence of the predefined state to the physical object in the future time period.

3. The method according to claim 2, wherein the decrease of the estimated probability of the occurrence of the predefined physical event or the probability of the occurrence of the predefined state to the physical object in the future time period is based on a transfer of risk to an automated risk-transfer system controlled by the digital device, further comprising:
optimizing values of parameters characterizing the transfer of risk based on the generated data structure.

4. The method according to claim 1, further comprising:
propagating parameters associated with the physical object for predicting the estimated probability of the occurrence of the predefined physical event or the probability of the occurrence of the predefined state to the physical object in the future time period.

5. The method according to claim 1, wherein the operational parameter and environmental status parameter comprise endogen parameters, whose values are determined by the physical object or exogen parameters, whose values origin from and are determined outside the physical object and are imposed on the physical object.

6. The method according to claim 5, wherein the digital device comprises exteroceptive sensors for sensing exogen environmental parameters physically impacting the physical object and proprioceptive sensors sensing endogen operating or status parameters of the physical object.

7. The method according to claim 5, wherein the plurality of sensors comprise interfaces for setting one or more wireless or wired connections between the digital device and the sensors, and
data links are set by the wireless or wired connections between the digital device and the sensors associated with the physical object transmitting the exogen and endogen parameters measured or captured by the sensors to the digital device.

8. The method according to claim 1, wherein the digital device triggers an automated expert system of the digital device with an electronic signal transfer, and
the digital device triggers transmitting a digital recommendation to a user interface generated by the expert system of the digital device based on the predicted estimated probability of the occurrence of the predefined physical event or the probability of the occurrence of the predefined state to the physical object in the future time period and the digital recommendation comprises indications for an optimization of the physical object or adaption of the at least one of the structural parameter, operational parameter, and environmental status parameter.

9. A digital device comprising:
circuitry configured to select object elements stored in a storage of the digital device, and assemble the selected object elements;
a plurality of sensors configured to measure at least one parameter of structural parameter, operational parameter, and environmental status parameter, the at least one parameter being associated with a physical object represented by the assembled object elements, wherein the assembled object elements include data structure representing states of subsystems of the physical object, and the data structure holds a value of the at least one parameter; and
the circuitry further configured to:
generate the data structure based on simulated effects of the at least one parameter on the physical object,
analyze the physical object based on the generated data structure for a future time period,
predict, based on analysis, an estimated probability of an occurrence of a predefined physical event with a certain strength or physical characteristic physically impacting the physical object by associated losses or predicting, based on the analysis, the probability of the occurrence of a predefined state to the physical object in the future time period, wherein a physically measurable probability for the occurrence of the predefined physical event is established based on the measured at least one parameter and based on frequency and severity of historical measuring data of the predefined physical event by a predicting machine learning module using measured historical timeseries data, and
trigger an adjustment of a subsystem of the physical object via an electronic signal transfer to optimize a status of the physical object based on the estimated probability of the occurrence of the predefined physical event or the probability of the occurrence of the predefined state to the physical object and the physically measurable probability.

10. The digital device according to claim 9, wherein the circuitry is further configured to adjust an operation of the physical object based on the predicted estimated probability of the occurrence of the predefined physical event or the probability of the occurrence of the predefined state to the physical object in the future time period, and
the operation is adjusted to jointly and severally increase operation performance criteria or decrease the estimated probability of the occurrence of the predefined physical event or the probability of the occurrence of the predefined state to the physical object in the future time period.

11. The digital device according to claim 10, wherein the decrease of the estimated probability of the occurrence of the predefined physical event or the probability of the occurrence of the predefined state to the physical object in the future time period is based on a transfer of risk to an automated risk-transfer system controlled by the digital device, and
the circuitry is further configured to optimizing values of parameters characterizing the transfer of risk based on the generated data structure.

12. The digital device according to claim 9, wherein the circuitry is further configured to propagate parameters associated with the physical object for predicting the estimated probability of the occurrence of the predefined physical event or the probability of the occurrence of the predefined state to the physical object in the future time period.

13. The digital device according to claim 9, wherein the operational parameter and environmental status parameter comprise endogen parameters, whose values are determined by the physical object or exogen parameters, whose values origin from and are determined outside the physical object and are imposed on the physical object.

14. The digital device according to claim 13, wherein the plurality of sensors include at least exteroceptive sensors for sensing exogen environmental parameters physically impacting the physical object and proprioceptive sensors sensing endogen operating or status parameters of the physical object.

15. The digital device according to claim 13, wherein the plurality of sensors comprise interfaces for setting one or more wireless or wired connections between the digital device and the sensors, and data links are set by the wireless or wired connections between the digital device and the sensors associated with the physical object transmitting the exogen and endogen parameters measured or captured by the sensors to the digital device.

16. The digital device according to claim 9, wherein the circuitry is further configured to trigger an automated expert system of the digital device with an electronic signal transfer, and the circuitry triggers transmitting a digital recommendation to a user interface generated by the expert system of the digital device based on the predicted estimated probability of the occurrence of the predefined physical event or the probability of the occurrence of the predefined state to the physical object in the future time period and the digital recommendation comprises indications for an optimization of the physical object or adaption of the at least one of the structural parameter, operational parameter, and environmental status parameter.

* * * * *